United States Patent
Lin et al.

(10) Patent No.: US 11,903,162 B2
(45) Date of Patent: Feb. 13, 2024

(54) FAN CONTROL METHOD FOR HEAT DISSIPATION OF AN ELECTRONIC DEVICE

(71) Applicant: ASUSTEK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 87 days.

(21) Appl. No.: 17/581,161

(22) Filed: Jan. 21, 2022

(65) Prior Publication Data

US 2022/0240415 A1    Jul. 28, 2022

(30) Foreign Application Priority Data

Jan. 26, 2021  (TW) .................. 110102874

(51) Int. Cl.
*H05K 7/20* (2006.01)
*G05B 15/02* (2006.01)

(52) U.S. Cl.
CPC ......... *H05K 7/20209* (2013.01); *G05B 15/02* (2013.01)

(58) Field of Classification Search
CPC ...... H05K 7/20209; G05B 15/02; G06F 1/206
See application file for complete search history.

(56) References Cited

U.S. PATENT DOCUMENTS

| 7,991,514 B2 | 8/2011 | Berenbaum et al. |
| 2008/0125915 A1* | 5/2008 | Berenbaum ........ G05D 23/1917 700/278 |
| 2015/0338314 A1* | 11/2015 | Meyer ............... F24F 11/30 73/40 |

FOREIGN PATENT DOCUMENTS

| CN | 107949247 A | 4/2018 |
| CN | 110848164 A | 2/2020 |
| CN | 111075746 A | 4/2020 |
| CN | 111503038 A | 8/2020 |
| TW | I319131 B | 1/2010 |
| TW | I356982 B | 1/2012 |

* cited by examiner

*Primary Examiner* — Mohammad Ali
*Assistant Examiner* — Saad M Kabir
(74) *Attorney, Agent, or Firm* — Muncy, Geissler, Olds & Lowe, P.C.

(57) ABSTRACT

The disclosure provides a fan control method, applied to an electronic device. The electronic device includes a fan and a setting unit, the setting unit having a plurality of setting values, and each setting value being corresponding to a sampling number. The fan control method includes: continuously detecting a temperature of a heat source to obtain a plurality of temperature values; selecting one of the plurality of setting values based on variations of the temperature values; acquiring a value set from the temperature values based on the sampling number corresponding to the selected setting value, and generating an updated temperature value based on the value set; and controlling rotation of the fan based on the updated temperature value.

8 Claims, 7 Drawing Sheets

FAN CONTROL METHOD FOR HEAT DISSIPATION OF AN ELECTRONIC DEVICE

CROSS-REFERENCE TO RELATED APPLICATIONS

This application claims the benefit of priority of Taiwan Patent Application No. TW110102874, filed on Jan. 26, 2021. The entirety of the above-mentioned patent application is hereby incorporated by reference herein and made a part of the specification.

BACKGROUND OF THE INVENTION

Field of the Invention

The disclosure relates to a fan control method, and in particular, to a fan control method for heat dissipation of an electronic device.

Description of the Related Art

A traditional fan control method for heat dissipation of an electronic device takes temperature data of an electronic element as a main reference index for controlling rotational speed of a fan. The rotational speed of the fan is correspondingly changed with variations of temperatures of the electronic element.

However, as the temperature of the electronic element, such as a central processing unit changes rapidly, performing different operation applications generates different temperature rising and falling. One traditional control method reacting rapidly to the temperature variation makes large fluctuation of the rotational speed of the fan. It generates noise easily, and causes poor use experience. Another traditional control method reacting slowly to the temperature variation solves the problem of noise, but when the electronic element operates with high loads, it is easy to cause the problem of slow response of heat dissipation control.

BRIEF SUMMARY OF THE INVENTION

The disclosure provides a fan control method, applied to an electronic device. The electronic device includes a fan and a setting unit, the setting unit having a plurality of setting values, and each setting value being corresponding to a sampling number. The fan control method includes: continuously detecting a temperature of a heat source to obtain a plurality of temperature values; selecting one of the plurality of setting values based on variations of the temperature values; acquiring a value set from the temperature values based on the sampling number corresponding to the selected setting value, and generating an updated temperature value based on the value set; and controlling rotation of the fan based on the updated temperature value.

By means of the fan control method and the fan control system of the disclosure, the sampling number is dynamically adjusted based on the sampling temperature to adapt to different load change scenarios, which not only conforms to heat dissipation requirements, but also improves the auditory perception of users. In addition, the fan control method and fan control system of the disclosure also change a reaction speed of the fan to a temperature value change in response to changes in loads, so that the fan control is adapted to different system application conditions.

DETAILED DESCRIPTION OF THE EMBODIMENTS

Specific embodiments of the disclosure are described in more detail below with reference to the schematic diagrams. Advantages and features of the disclosure will be clearer based on the following descriptions and claims. It is to be noted that all the figures are in a very simple form and in an inaccurate proportion, and are merely intended to assist description of the purpose of the embodiments of the disclosure conveniently and clearly.

Figure 1:
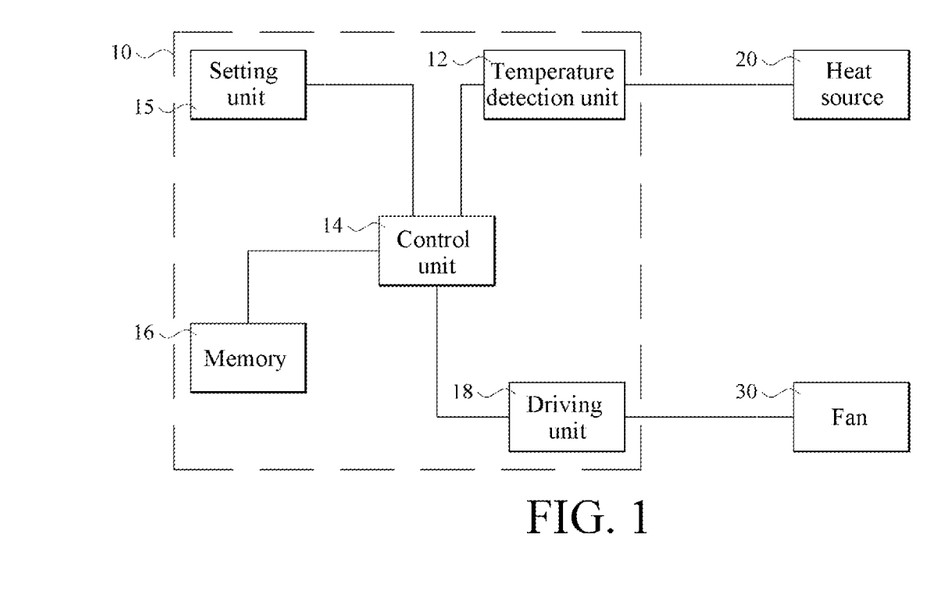
FIG. 1 is a schematic block diagram showing an embodiment of a fan control system according to the disclosure.

FIG. 1 is a schematic block diagram showing an embodiment of a fan control system according to the disclosure. The fan control system 10 is disposed in an electronic device, such as a computer host and a notebook computer that needs to be cooled by using a fan. The fan control system 10 is configured to detect a temperature of a heat source 20 to control a rotational speed of a fan 30. The heat source 20 is a wafer, a mainboard, or other electronic elements that generate heat during operation. As shown in the figure, the fan control system 10 includes a temperature detection unit 12, a control unit 14, a setting unit 15, a memory 16, and a driving unit 18.

The temperature detection unit 12 is configured to continuously detect the temperature of the heat source 20 to obtain a plurality of temperature values $S1, S2, \ldots, Sn-1$, and $Sn$. In one embodiment, the temperature detection unit 12 detects the temperature of the heat source 20 every preset time to obtain a temperature value, for example, the temperature of the heat source 20 is detected every one second.

The temperature values $S1, S2, \ldots, Sn-1$, and $Sn$ include a current temperature value (that is, a latest temperature value $Sn$) and a plurality of previous temperature values (that is, temperature values $S1, S2, \ldots,$ and $Sn-1$ detected prior to the current temperature value).

The control unit 14 obtains temperature values $S1, S2, \ldots, Sn-1$, and $Sn$ from the temperature detection unit 12, and selects one of a plurality of setting values based on variations of the temperature values $S1, S2, \ldots, Sn-1$, and $Sn$. The setting values correspond to different sampling numbers PN. The setting unit 15 includes a plurality of setting values for the control unit 14 to select.

In one embodiment, the setting values of the setting unit 15 are preset when a product leaves a factory. In one embodiment, the setting unit 15 also has a memory unit to store the setting values, which is not limited thereto. In one embodiment, the setting unit 15 directly stores the sampling number PN as well.

The control unit 14 also acquires a value set $G1 = \{Sn-m, \ldots, \text{and } Sn-1\}$ from the temperature values $S1, S2, \ldots, Sn-1$, and $Sn$ based on the sampling number PN (such as a positive integer m) corresponding to the selected setting value, and generates an updated temperature value $Sn'$ based on the value set $G1$.

After the updated temperature value Sn' is generated, the control unit 14 obtains a fan control graph from the memory 16, maps a corresponding target rotational speed in the fan control graph based on the updated temperature value Sn', and drives the fan 30 to rotate by means of the driving unit 18 based on the target rotational speed. The fan control graph is described in more detail in FIG. 3 of the disclosure. The operation details of the control unit 14 are described in the following paragraph corresponding to a fan control method.

Figure 2:
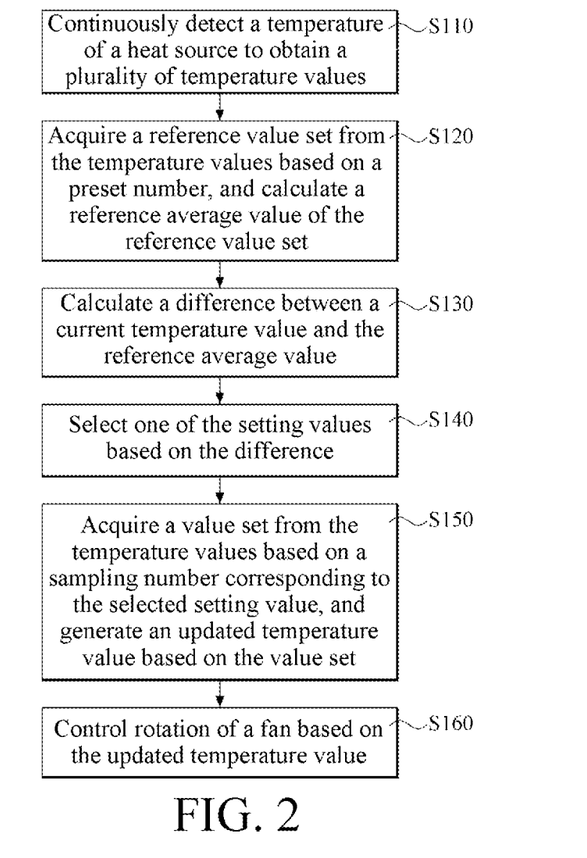
FIG. 2 is a flowchart showing a first embodiment of a fan control method according to the disclosure.

FIG. 2 is a flowchart showing a first embodiment of a fan control method according to the disclosure. The fan control method is applied to an electronic device. The electronic device includes a fan and a setting unit, the setting unit includes a plurality of setting values, and each setting value corresponds to a different sampling number. As shown in the figure, the fan control method includes the following steps.

Firstly, as described in step S110, a temperature of a heat source 20 is continuously detected to obtain a plurality of temperature values $S1, S2, \ldots, Sn-1$, and Sn. The temperature values $S1, S2, \ldots, Sn-1$, and Sn include a current temperature value (that is, a temperature value Sn) and a plurality of previous temperature values (that is, the temperature values $S1, S2, \ldots$, and $Sn-1$).

Then, the fan control method includes selecting one of a plurality of setting values based on variations of the temperature values $S1, S2, \ldots, Sn-1$, and Sn. The selection logic is as follows. When the variation between the previous temperature value and the current temperature value is rapid, a setting value of a sampling number PN corresponding to a smaller value tends to be selected.

When the variation between the previous temperature value and the current temperature value is gentle, a setting value of the sampling number PN corresponding to a larger value tends to be selected. When the temperature value shows a decreasing temperature change, the setting value of the sampling number PN corresponding to the larger value tends to be selected.

In one embodiment of the disclosure, as described in step S120, firstly, a reference value set G0 is acquired from the temperature values $S1, S2, \ldots, Sn-1$, and Sn based on a preset number i, and a reference average value A0 of the reference value set G0 is calculated. A temperature value in the reference value set G0 is a latest temperature value in the previous temperature values. A number of the temperature values in the reference value set G0 is the preset number i.

In one embodiment, the preset number i is one of the sampling numbers PN. In one embodiment, the preset number i is the sampling number PN used for previously controlling a fan 30 to rotate. In an embodiment, assuming the temperature values detected in step S110 are $S1, S2, \ldots, Sn-1$, and Sn, Sn is the current temperature value, and $S1, S2, \ldots$, and $Sn-1$ are the previous temperature values. When the sampling number PN used for previously controlling the fan 30 to rotate is 5, in step S120, an average of the temperature values $Sn-5, Sn-4, \ldots$, and $Sn-1$ is calculated as the reference average value A0.

Next, as described in step S130, a difference d (d=Sn−A0) between the current temperature value Sn and the reference average value A0 is calculated. The difference d shows variations of the temperature values. When the difference d is relatively large, it indicates that the current temperature varies rapidly. When the difference d is relatively small, it indicates that the current temperature maintains stable. When the difference d is negative, it indicates that the temperatures are decreased progressively.

Then, as described in step S140, one of the plurality of setting values is selected based on the difference d. The selection logic is as follows. When the difference d is relatively large, a setting value of a sampling number PN corresponding to a smaller value tends to be selected. When the difference d is relatively small, a setting value of the sampling number PN corresponding to a larger value tends to be selected. When the difference d is negative, the setting value of the sampling number PN corresponding to the larger value tends to be selected. Various different embodiments of step S140 are described in more detail in the following paragraphs.

Then, as described in step S150, a value set G1={$Sn-m, \ldots$, and $Sn-1$} is acquired from the temperature values $S1, S2, \ldots, Sn-1$, and Sn based on the sampling number PN (such as a positive integer m) corresponding to the selected setting value, and an updated temperature value Sn' is generated based on the value set G1. In one embodiment, the updated temperature value Sn' is an average value of the value set G1. In an embodiment, when the sampling number corresponding to the selected setting value is 10, in step S150, temperature values $Sn-10, Sn-9, \ldots$, and $Sn-1$ are acquired as the value set G1, and the average value A1 of the temperature values $Sn-10, Sn-9, \ldots$, and $Sn-1$ is calculated as the updated temperature value Sn'.

Figure 3:
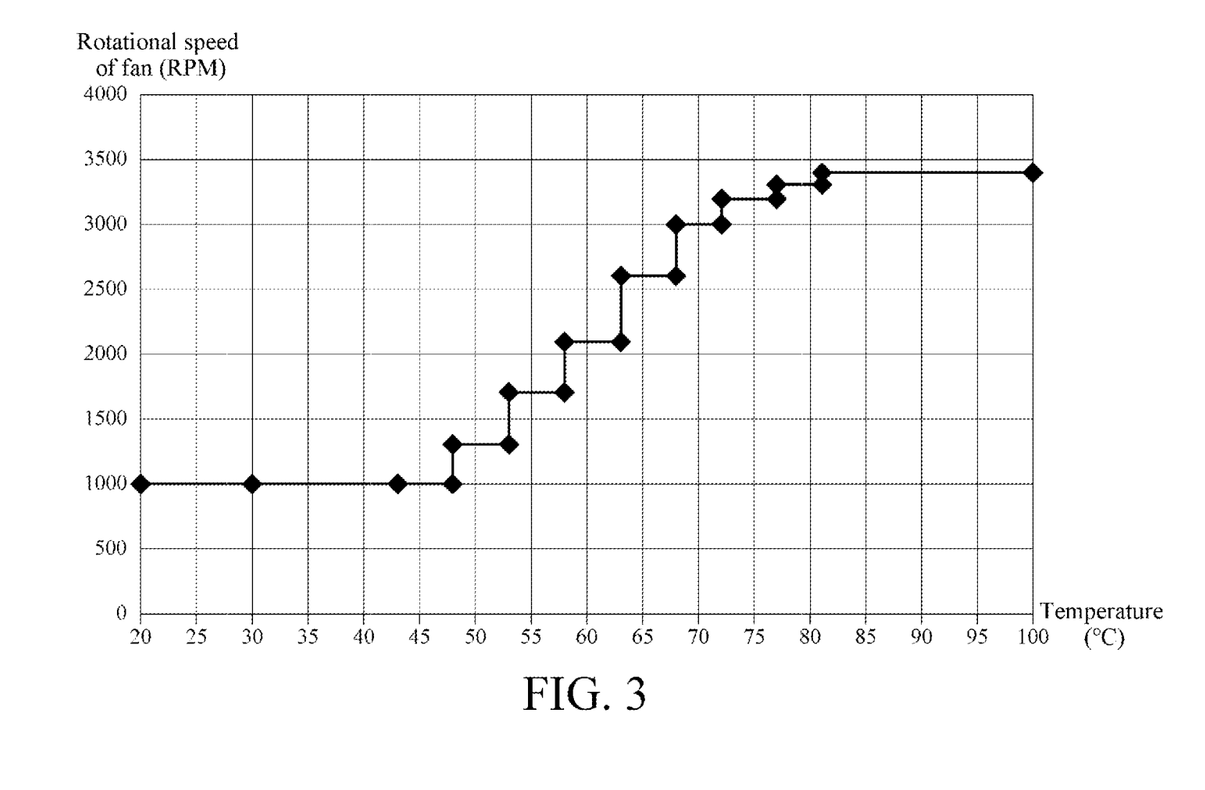
FIG. 3 shows a fan control graph.

Then, as described in step S160, the fan 30 is controlled, based on the updated temperature value Sn', to rotate. In one embodiment, in step S160, a target rotational speed is mapped, based on the updated temperature value Sn', in the fan control graph to control the fan 30 to rotate. Referring to FIG. 3 as well, FIG. 3 shows the fan control graph. As shown in the figure, a horizontal axis and a vertical axis of the fan control graph respectively represent temperatures (° C.) and rotational speeds (RPM) of a fan to show a correspondence between the temperature and the fan speed. A corresponding target rotational speed is found, based on a given temperature value, in the fan control graph to control the fan 30 to rotate.

Referring to FIG. 1 as well, in one embodiment, step S110 of the fan control method is performed by the temperature detection unit 12 and the control unit 14 in FIG. 1, steps S120 to S150 are performed by the control unit 14 in FIG. 1, and step S160 is performed by the control unit 14 and the driving unit 18 in FIG. 1. The fan control graph is stored in the memory 16 in FIG. 1.

In steps S120 to S150 of the above embodiments, the current temperature value (that is, the temperature value Sn) is not included in the acquired reference value set G0 and value set G1, which is not limited thereto. In one embodiment, the current temperature value (that is, the temperature value Sn) is also included in the reference value set G0 and the value set G1 for calculation. In an embodiment, when the preset number i in step S120 is 5, in step S120, the average value of temperature values $Sn-4, Sn-3, Sn-1$, and Sn is calculated as the reference average value 0.

Figure 4:
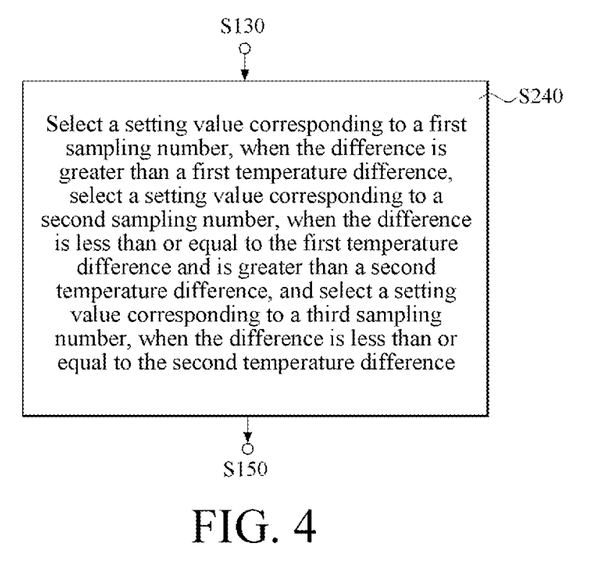
FIG. 4 is a flowchart showing a second embodiment of the fan control method according to the disclosure.

FIG. 4 is a flowchart showing a second embodiment of the fan control method according to the disclosure. A main difference between this embodiment and the embodiment of FIG. 2 lies in the step (corresponding to step S140 of FIG. 2) of selecting one of the plurality of setting values based on the difference d. Other steps of this embodiment are similar to the embodiment of FIG. 2, and details are not described herein.

Referring to FIG. 1 as well, in this embodiment, the setting unit 15 presets a first temperature difference Td1 and a second temperature difference Td2, and sets three setting values respectively corresponding to a first sampling number PN1, a second sampling number PN2, and a third sampling number PN3. The first temperature difference Td1 is greater than the second temperature difference Td2, the first sampling number PN1 is less than the second sampling number PN2, and the second sampling number PN2 is less than the third sampling number PN3.

Carrying on with step S130, as described in step S240, when the difference d is greater than the first temperature difference Td1, a setting value corresponding to the first sampling number PN1 is selected. When the difference d is less than or equal to the first temperature difference Td1 and is greater than the second temperature difference Td2, a setting value corresponding to the second sampling number PN2 is selected. When the difference d is less than or equal to the second temperature difference Td2, a setting value corresponding to the third sampling number PN3 is selected.

The sampling number corresponding to the setting value selected in step S240, that is, the first sampling number PN1, the second sampling number PN2, or the third sampling number PN3, is used in step S150 of FIG. 2 to acquire the value set G1.

Figure 5:
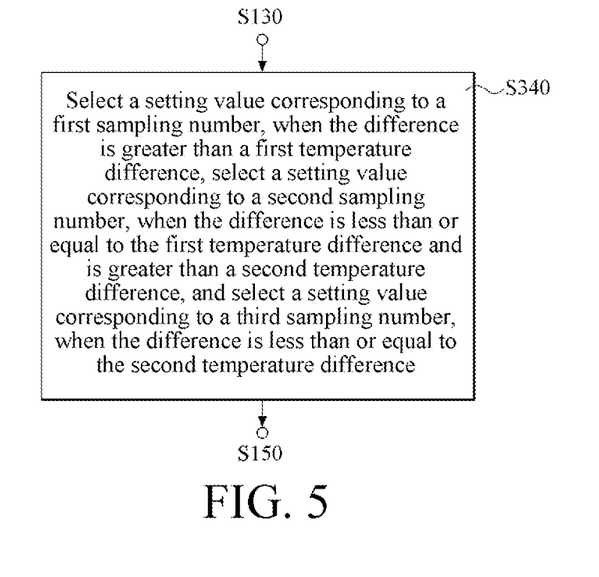
FIG. 5 is a flowchart showing a third embodiment of the fan control method according to the disclosure.

FIG. 5 is a flowchart showing a third embodiment of the fan control method according to the disclosure. A main difference between this embodiment and the embodiment of FIG. 2 lies in the step (corresponding to step S140 of FIG. 2) of selecting one of the plurality of setting values based on the difference d. Other steps of this embodiment are similar to the embodiment of FIG. 2, and details are not described herein.

Referring to FIG. 1 as well, in this embodiment, the setting unit 15 presets a first temperature difference Td1 and a second temperature difference Td2, and sets three setting values respectively corresponding to a first sampling number PN1, a second sampling number PN2', and a third sampling number PN3. The first temperature difference Td1 is greater than the second temperature difference Td2, the first sampling number PN1 is less than the second sampling number PN2', the second sampling number PN2' is less than the third sampling number PN3, and the second sampling number PN2' corresponds to a preset equation. In other words, the second sampling number PN2' is calculated based on the difference d by using the preset equation.

Carrying on with step S130, as described in step S340, when the difference d is greater than the first temperature difference Td1, a setting value corresponding to the first sampling number PN1 is selected. When the difference d is less than or equal to the first temperature difference Td1 and is greater than the second temperature difference Td2, a setting value corresponding to the second sampling number PN2' is selected. When the difference d is less than or equal to the second temperature difference Td2, a setting value corresponding to the third sampling number PN3 is selected.

The sampling number corresponding to the setting value selected in step S340, that is, the first sampling number PN1, the second sampling number PN2', or the third sampling number PN3, is used in step S150 of FIG. 2 to acquire the value set G1.

Compared with the embodiment of FIG. 4, the second sampling number PN2 is a constant, but the second sampling number PN2' of this embodiment varies with the difference d. In one embodiment, the preset equation includes a linear equation. In one embodiment, the linear equation is a negatively related linear equation. In other words, an increase in the difference d indicates a decrease in the second sampling number PN2'.

Figure 6:
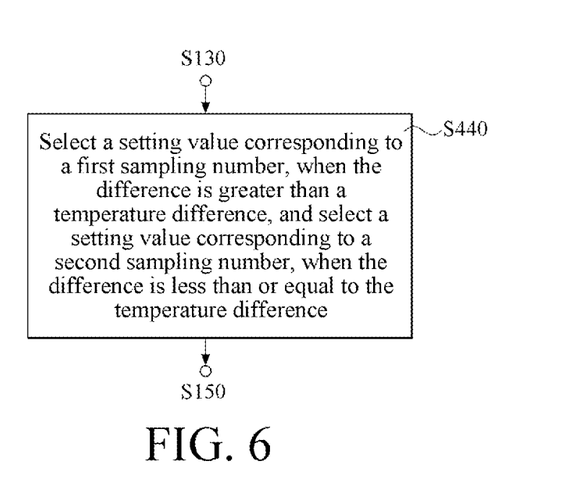
FIG. 6 is a flowchart showing a fourth embodiment of the fan control method according to the disclosure.

FIG. 6 is a flowchart showing a fourth embodiment of the fan control method according to the disclosure. A main difference between this embodiment and the embodiment of FIG. 2 lies in the step (corresponding to step S140 of FIG. 2) of selecting one of the plurality of setting values based on the difference d. Other steps of this embodiment are similar to the embodiment of FIG. 2, and details are not described herein.

Referring to FIG. 1 as well, in this embodiment, the setting unit 15 presets a temperature difference Td, and sets two setting values respectively corresponding to a first sampling number PN1 and a second sampling number PN2. The first sampling number PN1 is less than the second sampling number PN2.

Carrying on with step S130, as described in step S440, when the difference d is greater than the temperature difference Td, a setting value corresponding to the first sampling number PN1 is selected. When the difference d is less than or equal to the temperature difference Td, a setting value corresponding to the second sampling number PN2 is selected.

The sampling number corresponding to the setting value selected in step S440, that is, the first sampling number PN1 or the second sampling number PN2, is used in step S150 of FIG. 2 to acquire the value set G1.

In the embodiments of FIG. 4 and FIG. 5, the difference d is compared with two preset temperature differences (that is, the first temperature difference Td1 and the second temperature difference Td2), to generate comparison results of three stages, and then the setting values are selected based on the comparison results.

In the embodiment of FIG. 6, the difference d is compared with a preset temperature difference Td to generate comparison results of two stages, and then the setting values are selected based on the comparison results, which is not limited thereto. According to actual fan control requirements, in other embodiments, by means of the disclosure, a larger number of temperature differences and a larger number of setting values are set to generate comparison results of more stages to control the rotational speed of a fan, so as to achieve more accurate control of the rotational speed of the fan.

Secondly, in the embodiments of FIG. 4 to FIG. 6, the first sampling number PN1, the second sampling number PN2, and the third sampling number PN3 that are preset are provided for selection, which is not limited thereto.

In other embodiments, an adjustment amount of the sampling number is also generated based on the difference d to increase or decrease the sampling number for previously controlling the rotation of the fan 30, so as to achieve an effect of controlling the rotation of the fan by dynamically adjusting the sampling number.

Figure 7:
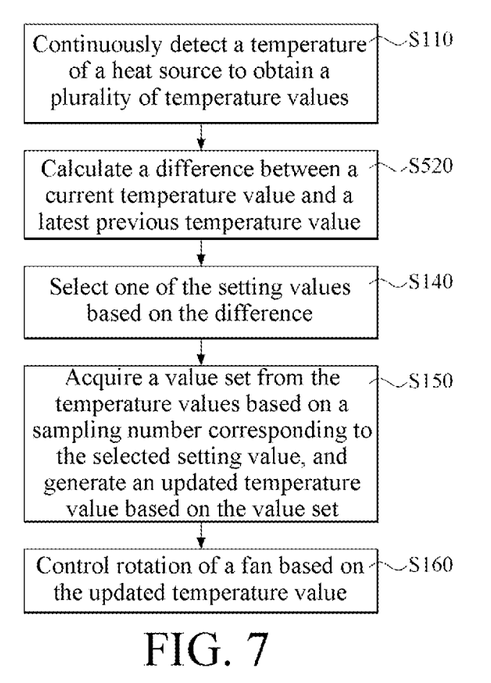
FIG. 7 is a flowchart showing a fifth embodiment of the fan control method according to the disclosure.

FIG. 7 is a flowchart showing a fifth embodiment of the fan control method according to the disclosure. A main difference between this embodiment and the embodiment of FIG. 2 lies in the step (that is, step S120 and S130 of FIG. 2) of calculating the difference d.

In the embodiment of FIG. 2, a reference value set G0 is acquired from the temperature values based on a preset number i, a reference average value A0 of the reference value set G0 is calculated, and the difference d between the current temperature value (that is, the temperature value Sn) and the reference average value A0 is calculated.

By comparison, as described in step S520, in this embodiment, a difference d' between the current temperature value (that is, the temperature value Sn) and a latest previous temperature value (that is, the temperature value Sn−1) is directly calculated, and then a sampling number corresponding to a setting value is selected based on the difference d'.

By means of the fan control method and the fan control system of the disclosure, the sampling number is dynamically adjusted based on the sampling temperature to adapt to different load change scenarios, which not only conforms to heat dissipation requirements, but also improves the auditory perception of users. In addition, the fan control method and fan control system of the disclosure also change a reaction speed of the fan to a temperature value change in response to changes in loads, so that the fan control is adapted to different system application conditions.

The above is merely exemplary embodiments of the disclosure, and does not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A fan control method, applied to an electronic device, the electronic device comprising a fan and a setting unit, the setting unit having a plurality of setting values, each of the setting values corresponding to a sampling number, the fan control method comprising:
   continuously detecting a temperature of a heat source to obtain a plurality of temperature values;
   selecting one of the setting values based on variations of the temperature values;
   acquiring a value set from the temperature values based on the sampling number corresponding to the selected setting value, and generating an updated temperature value based on the value set; and
   controlling rotation of the fan based on the updated temperature value;
   wherein the temperature values comprise a current temperature value, and the step of selecting one of the setting values based on the variations of the temperature values comprises:
      acquiring a reference value set from the temperature values based on a preset number, and calculating a reference average value of the reference value set;
      calculating a difference between the current temperature value and the reference average value; and
      selecting one of the setting values based on the difference;
   wherein the sampling numbers comprise a first sampling number and a second sampling number, the first sampling number is less than the second sampling number, the setting unit has a temperature difference, and the step of selecting one of the setting values based on the difference comprises:
      selecting the setting value corresponding to the first sampling number, when the difference is greater than the temperature difference; and
      selecting the setting value corresponding to the second sampling number, when the difference is less than or equal to the temperature difference.

2. The fan control method according to claim 1, wherein the preset number is one of the sampling numbers.

3. The fan control method according to claim 1, wherein the temperature values comprise a current temperature value and at least one previous temperature value, and the step of selecting one of the setting values based on the variations of the temperature values comprises:
   calculating a difference between the current temperature value and a latest previous temperature value; and
   selecting one of the setting values based on the difference.

4. The fan control method according to claim 1, wherein the step of controlling the rotation of the fan based on the updated temperature value comprises: mapping a target rotation speed value on a fan control graph based on the updated temperature value to control the rotation of the fan.

5. The fan control method according to claim 1, wherein the updated temperature value is an average value of the value set.

6. A fan control method, applied to an electronic device, the electronic device comprising a fan and a setting unit, the setting unit having a plurality of setting values, each of the setting values corresponding to a sampling number, the fan control method comprising:
   continuously detecting a temperature of a heat source to obtain a plurality of temperature values;
   selecting one of the setting values based on variations of the temperature values;
   acquiring a value set from the temperature values based on the sampling number corresponding to the selected setting value, and generating an updated temperature value based on the value set; and
   controlling rotation of the fan based on the updated temperature value;
   wherein the temperature values comprise a current temperature value, and the step of selecting one of the setting values based on the variations of the temperature values comprises:
      acquiring a reference value set from the temperature values based on a preset number, and calculating a reference average value of the reference value set;
      calculating a difference between the current temperature value and the reference average value; and
      selecting one of the setting values based on the difference;
   wherein the sampling numbers comprise a first sampling number, a second sampling number, and a third sampling number, the first sampling number is less than the second sampling number, the second sampling number is less than the third sampling number, the setting unit has a first temperature difference and a second temperature difference, the first temperature difference is greater than the second temperature difference, and the step of selecting one of the setting values based on the difference comprises:
      selecting the setting value corresponding to the first sampling number, when the difference is greater than the first temperature difference;
      selecting the setting value corresponding to the second sampling number, when the difference is less than or equal to the first temperature difference and is greater than the second temperature difference; and
      selecting the setting value corresponding to the third sampling number, when the difference is less than or equal to the second temperature difference.

7. A fan control method, applied to an electronic device, the electronic device comprising a fan and a setting unit, the setting unit having a plurality of setting values, each of the setting values corresponding to a sampling number, the fan control method comprising:
   continuously detecting a temperature of a heat source to obtain a plurality of temperature values;
   selecting one of the setting values based on variations of the temperature values;
   acquiring a value set from the temperature values based on the sampling number corresponding to the selected setting value, and generating an updated temperature value based on the value set; and controlling rotation of the fan based on the updated temperature value;

wherein the temperature values comprise a current temperature value, and the step of selecting one of the setting values based on the variations of the temperature values comprises:

acquiring a reference value set from the temperature values based on a preset number, and calculating a reference average value of the reference value set;

calculating a difference between the current temperature value and the reference average value; and selecting one of the setting values based on the difference;

wherein the sampling numbers comprise a first sampling number, a second sampling number, and a third sampling number, the first sampling number is less than the second sampling number, the second sampling number is less than the third sampling number and corresponds to a preset equation, the setting unit has a first temperature difference and a second temperature difference, the first temperature difference is greater than the second temperature difference; and the step of selecting one of the setting values based on the difference comprises:

selecting the setting value corresponding to the first sampling number, when the difference is greater than the first temperature difference;

selecting the setting value corresponding to the second sampling number, when the difference is less than or equal to the first temperature difference and is greater than the second temperature difference; and selecting the setting value corresponding to the third sampling number, when the difference is less than or equal to the second temperature difference.

8. The fan control method according to claim 7, wherein the preset equation comprises a linear equation.

\* \* \* \* \*